United States Patent
Apel et al.

(10) Patent No.: US 8,159,048 B2
(45) Date of Patent: Apr. 17, 2012

(54) BIPOLAR JUNCTION TRANSISTOR GEOMETRY

(75) Inventors: Thomas R. Apel, Portland, OR (US);
Jeremy R. Middleton, Beaverton, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/769,571

(22) Filed: Jan. 30, 2004

(65) Prior Publication Data
US 2005/0167747 A1 Aug. 4, 2005

(51) Int. Cl.
*H01L 27/102* (2006.01)
(52) U.S. Cl. ........ 257/587; 257/573; 257/584; 257/592; 257/E29.114; 257/E29.171
(58) Field of Classification Search .......... 257/E29.114, 257/E29.171, 587, 592, 573, 584
See application file for complete search history.

(56) References Cited

U.S. PATENT DOCUMENTS

| 4,889,824 | A | * | 12/1989 | Selle et al. | 438/318 |
| 5,266,819 | A | * | 11/1993 | Chang et al. | 257/198 |
| 5,318,916 | A | * | 6/1994 | Enquist et al. | 438/320 |
| 5,512,496 | A | * | 4/1996 | Chau et al. | 438/315 |
| 5,519,358 | A | * | 5/1996 | Tserng | 330/307 |
| 5,614,758 | A | * | 3/1997 | Hebert | 257/579 |
| 6,242,967 | B1 | * | 6/2001 | Iwamuro et al. | 327/432 |
| 6,586,782 | B1 | | 7/2003 | Finlay | |
| 6,627,925 | B1 | | 9/2003 | Finlay | |
| 2005/0023643 | A1 | * | 2/2005 | Li et al. | 257/565 |

FOREIGN PATENT DOCUMENTS

| JP | 57-114277 | 7/1982 |
| JP | 2000-208530 | 7/2000 |

OTHER PUBLICATIONS

William Liu, "Handbook of III-V Heterojunction Bipolar Transistors", Copyright 1998 by John Wiley & Sons, Inc., 4 Pgs.
Johnson, et al., "Base-Collector Capacitance Reduction of AlGaAs/GaAs Heterojunction Bipolar Transistors by Deep Ion Implantation" Jun. 1995, 20 Pgs.
Harry F. Cooke, "Microwave Transistors: Theory and Design", IEEE, vol. 59, Aug. 1971, pp. 68-86.
Chen, et al., "Bipolar Microwave Linear Power Transistor Design", IEEE Transactions on Microwave Theory and Techniques. vol. 27, No. 5, May 1979, 8 Pgs.
Japanese Patent Office; Office Action in co-pending JP2006-551507 dated Oct. 18, 2011.

* cited by examiner

*Primary Examiner* — Matthew E Warren
(74) *Attorney, Agent, or Firm* — Schwabe Williamson & Wyatt (57) ABSTRACT

Embodiments of methods, apparatus, devices and/or systems associated with bipolar junction transistor are disclosed.

20 Claims, 9 Drawing Sheets

Hairpin

FIG. 20
(Prior Art)

| | $E_A$ | $E_P$ | $B_A$ | $B_{CP}$ | $E_A/B_A$ | $E_P/\sqrt{B_A}$ | $E_P/B_{CP}$ | FOM-1 | FOM-2 |
|---|---|---|---|---|---|---|---|---|---|
| M1 | 300.0 | 206.4 | 674.0 | 120.6 | 0.445 | 7.950 | 1.711 | 1.490 | 0.952 |
| M2 | 306.0 | 210.4 | 698.6 | 122.6 | 0.438 | 7.960 | 1.716 | 1.444 | 0.917 |
| M3 | 403.3 | 275.2 | 928.7 | 171.2 | 0.434 | 9.031 | 1.607 | 1.611 | 1.207 |
| M4 | 416.1 | 275.2 | 928.7 | 171.2 | 0.448 | 9.031 | 1.607 | 1.715 | 1.284 |
| M5 | 354.0 | 235.2 | 765.0 | 142.2 | 0.463 | 8.504 | 1.654 | 1.723 | 1.198 |
| M6 | 409.5 | 272.2 | 878.2 | 171.8 | 0.466 | 9.185 | 1.584 | 1.890 | 1.471 |
| M7 | 242.0 | 242.2 | 630.1 | 159.8 | 0.384 | 9.649 | 1.516 | 1.347 | 1.188 |
| M8 | 303.5 | 254.2 | 710.2 | 165.8 | 0.427 | 9.538 | 1.533 | 1.648 | 1.406 |
| M9 | 317.4 | 315.2 | 821.3 | 216.6 | 0.387 | 10.999 | 1.455 | 1.555 | 1.553 |
| M10 | 408.8 | 335.2 | 925.7 | 230.6 | 0.442 | 11.017 | 1.454 | 2.033 | 2.039 |
| M11 | 193.4 | 156.0 | 434.7 | 86.6 | 0.445 | 7.482 | 1.801 | 1.401 | 0.795 |
| M12 | 253.5 | 193.8 | 554.8 | 116.0 | 0.457 | 8.228 | 1.671 | 1.624 | 1.102 |

BIPOLAR JUNCTION TRANSISTOR GEOMETRY

BACKGROUND

This disclosure is related to transistors and, more particularly, to bipolar junction transistors.

A variety of factors may affect bipolar junction transistor performance. At least one potential factor is the particular geometry employed for contacting the semiconductor layers of the transistor. A need, therefore, continues to exist for bipolar junction transistor geometries that result in improved transistor performance.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

DETAILED DESCRIPTION

In the following detailed description, numerous specific details are set forth to provide a thorough understanding of the claimed subject matter. However, it will be understood by those skilled in the art that the claimed subject matter may be practiced without these specific details. In other instances, well-known methods, procedures, components and/or circuits have not been described in detail so as not to obscure the claimed subject matter.

As previously indicated, a variety of factors may affect bipolar junction transistor (BJT) performance. At least one factor is the particular geometry employed. For example, this may refer to the geometry employed for the semiconductor epitaxial layers and/or the conductive contact layers, typically made of a metal, for example. In particular, the power gain and power added efficiency performance of a transistor may be affected by undesirable capacitance between collector and base contacts and by undesirable extrinsic resistance in series with the base. For example, as explained in more detail hereinafter, for one embodiment, the particular geometry associated with emitter, base, and collector layers and associated contact layers may impact this capacitance and this resistance.

Although the claimed subject matter is not limited in scope in this respect, heterojunction bipolar transistors (HBTs), as one example of a BJT, are sometimes employed in radio frequency (RF) or microwave power amplifier applications, for example. In such an application, power gain and power added efficiency are frequently considerations affecting overall design, which may include the selection of particular semiconductor materials for the transistors and/or the particular transistor geometry, although these are examples and the claimed subject matter is not limited in scope to only these considerations. Other aspects of the transistor other than materials and geometry may also affect performance.

One example of a figure of merit for a BJT includes its capability to introduce current gain. Current gain in a conventional npn transistor, for example, is dependent at least in part on how much more the emitter is doped n-type with respect to p-type doping. To have a high gain transistor, one may dope the emitter heavily while keeping the base doping low. Lowering base doping may suggest widening the base width if one wishes to maintain the base resistivity to a low level. On the other hand, widening the base increases the charge carrier transit time across the base region, which may slow the device.

Heterojunction bipolar transistors (HBTs) which are BJTs composed of at least two different semiconductors provide an approach to address this trade-off. As a result of employing more than one semiconductor material, the energy band gap, as well as other material properties, may be different in the emitter, base, and collector than with a typical homojunction BJT. Moreover, a gradual change called grading of the material is possible in these regions.

As suggested above, the trade-off described between gain and speed of a BJT may be relaxed with an HBT. The basic form of an HBT comprises a BJT with an emitter made of a material with a band gap wider than in the rest of the device. One technique to create a wide band gap emitter in a BJT is to use the properties of an AlGaAs/GaAs heterojunction, although, of course, the claimed subject matter is not limited in scope in this respect. AlGaAs comprises GaAs with a percentage of gallium atoms replaced by aluminum. The band gap of AlGaAs widens with increasing AlAs mole fraction in the crystal.

The current gain of a wide band gap emitter BJT depends, besides the emitter-base doping, at least in part on the band gap difference between emitter and base, potentially providing more freedom in choosing device doping levels. Having a wide band gap emitter, one may reduce the emitter-base doping ratio and still maintain a relatively high current gain. Sometimes the base is even more heavily doped than the emitter in an HBT. Having a heavily doped base, one may reduce base width without sacrificing low resistivity of the base, as is desirable. This reduces carrier transit time across the base and the device may speed up. Thus, HBTs provide high gain and high frequency capability, as is frequently desirable in certain applications.

Thus, AlGaAs/GaAs HBTs, for example, are used for digital and analog microwave applications with relatively high frequencies, although, of course the claimed subject matter is not limited in scope in this respect. Another example of HBT compound materials include InGaP/GaAs. HBTs may provide faster switching speeds at least in part due to reduced capacitance and resistance. Likewise, HBT processing may involve less demanding lithography than GaAs field-effect transistors (FETs), for example, thus, potentially reducing cost and/or increasing yield. HBTs may also provide higher breakdown voltages and broader band impedance matching than GaAs FETs.

In comparison with homojunction BJTs, HBTs may show better performance in terms of emitter injection efficiency, base resistance, base-emitter capacitance and cut off frequency. They may also provide good linearity, low phase noise and high power-added efficiency. Thus, typical applications that employ HBTs include power amplifiers in mobile phones and laser drivers, although, of course, the claimed subject matter is not limited in scope to these particular applications or to HBTs.

It is likewise noted that the maximum oscillation frequency (Fmax) for an HBT is inversely correlated to the square-root of extrinsic base resistance (Rb') and collector-base capacitance (Ccb), as illustrated by the following relationship:

$$Fmax \approx (Ft/(8\pi(Rb')(Ccb)))^{1/2} \quad [1]$$

where Ft is the transit frequency.

Thus, in addition to the advantages previously discussed, lowering resistance and capacitance increases the maximum oscillation frequency.

Figure 1:
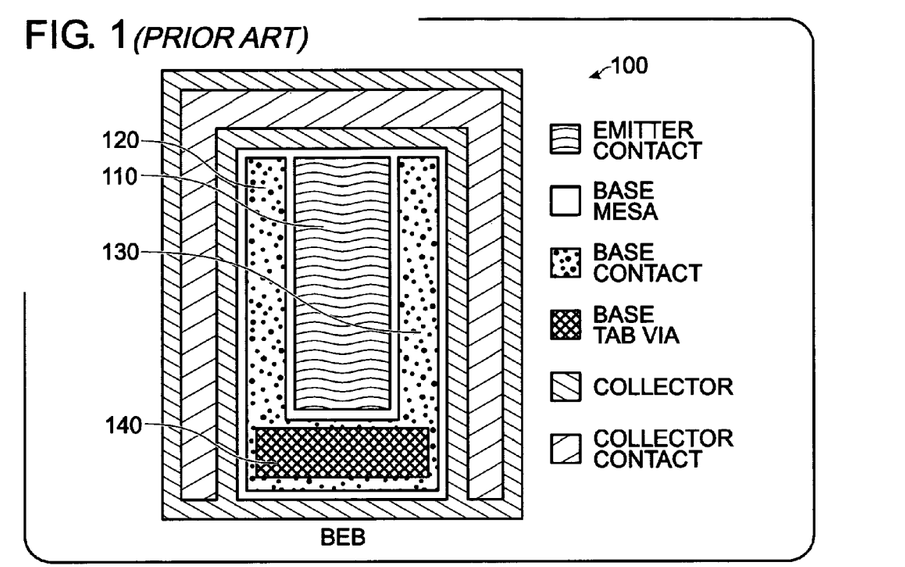
FIGS. 1 and 2 are plan diagrams of embodiments of BEB (Base-Emitter-Base) geometry type interdigital transistor structures.
Figure 2:
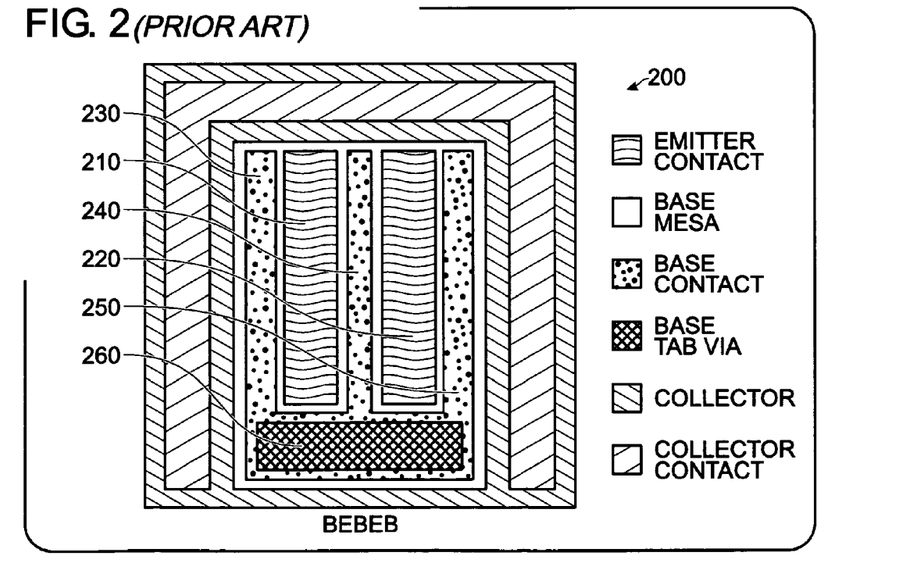
Figure 3:
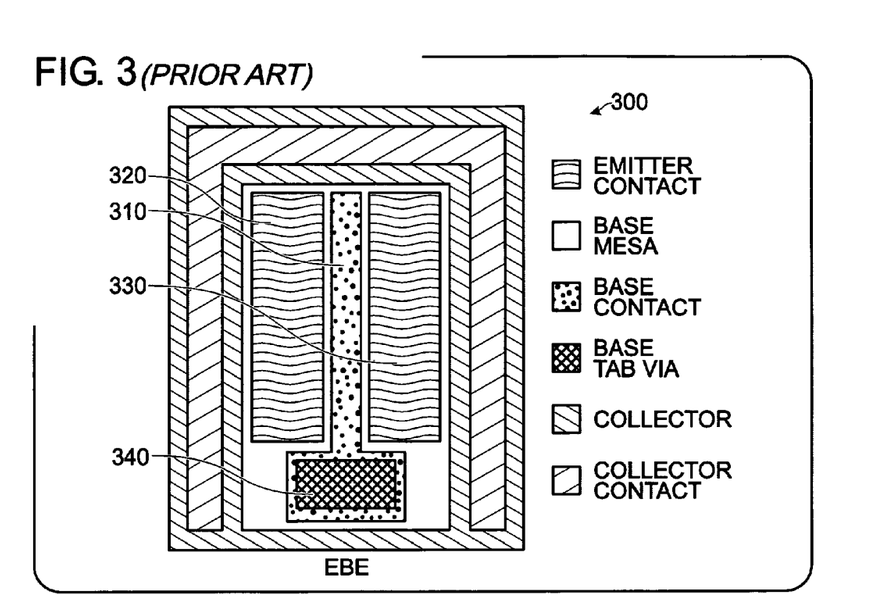
FIGS. 3 and 4 are plan diagrams of embodiments of EBE (Emitter-Base-Emitter) geometry type interdigital transistor structures.
Figure 4:
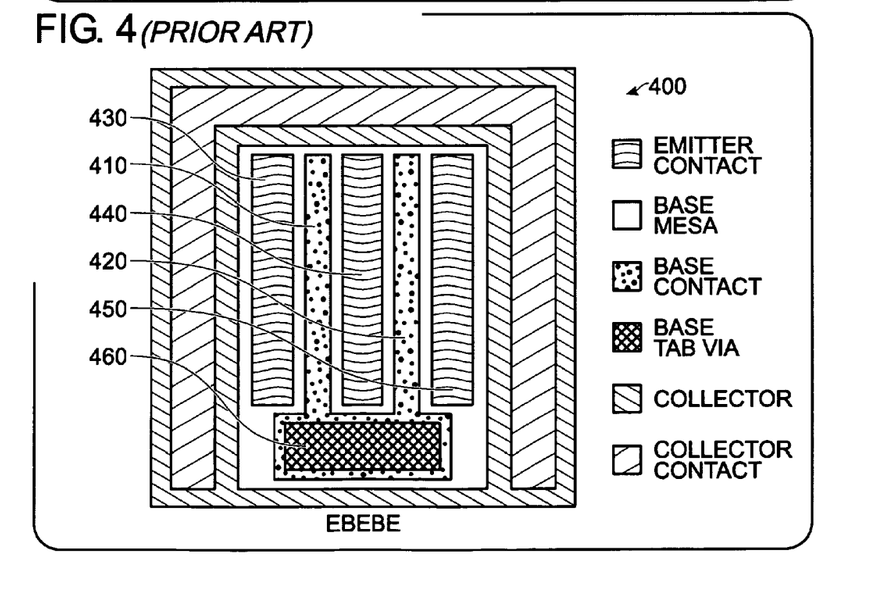

The geometry of a transistor, such as an HBT, for example, in addition to the materials employed, may also affect capacitance and resistance of the device. Typical HBT geometries are sometimes referred to as interdigital structures or alternating emitter and base fingers. These may be viewed as in two families, Base-Emitter-Base (BEB) and Emitter-Base-Emitter (EBE) geometries. FIGS. 1 and 2, for example, illustrate two embodiments, 100 and 200, respectively, of a BEB interdigital transistor structure, and FIGS. 3 and 4 illustrate two embodiments, 300 add 400, respectively, of an EBE interdigital transistor structure. It is noted that these particular figures are plan views rather than cross-sectional views of such structures. As illustrated by FIGS. 1 and 2, a BEB interdigital transistor structure includes one more base finger than emitter fingers, whereas an EBE interdigital structure includes one more emitter finger than base fingers. Thus, in FIG. 1, 120 and 130 comprise base fingers, while 110 comprises an emitter finger. Likewise, 140 comprises a base tab via that allows an electrical connection through direct physical contact to the base region. Similarly, in FIG. 2, 230, 240 and 250 comprise base fingers, and 210 and 220 comprise emitter fingers. Likewise, 260 comprises a base tab via that allows an electrical connection through direct physical contact to the base region. In FIG. 3, 320 and 330 comprise emitter fingers, whereas 310 comprises a base finger. Similarly, 340 comprises a base tab via. In FIG. 4, 430, 440, and 450 comprise emitter fingers, and 410 and 420 comprise base fingers. 460 comprises a base tab via.

It is noted that more pairs of fingers may be employed than specifically illustrated by FIGS. 1 to 4. Thus, as FIGS. 1 and 2 illustrate, while two and three base fingers respectively are employed, more base fingers, and correspondingly more emitter fingers, may be employed. Likewise, for FIGS. 3 and 4, two and three emitter fingers are illustrated, respectively, although additional emitter, and correspondingly base, fingers may be employed in other embodiments. As one example, RF Microdevices, based in Greensboro, N.C., a company that manufactures BJTs, is believed to employ an interdigital structure with 4 emitter fingers and 5 base fingers.

Figure 18:
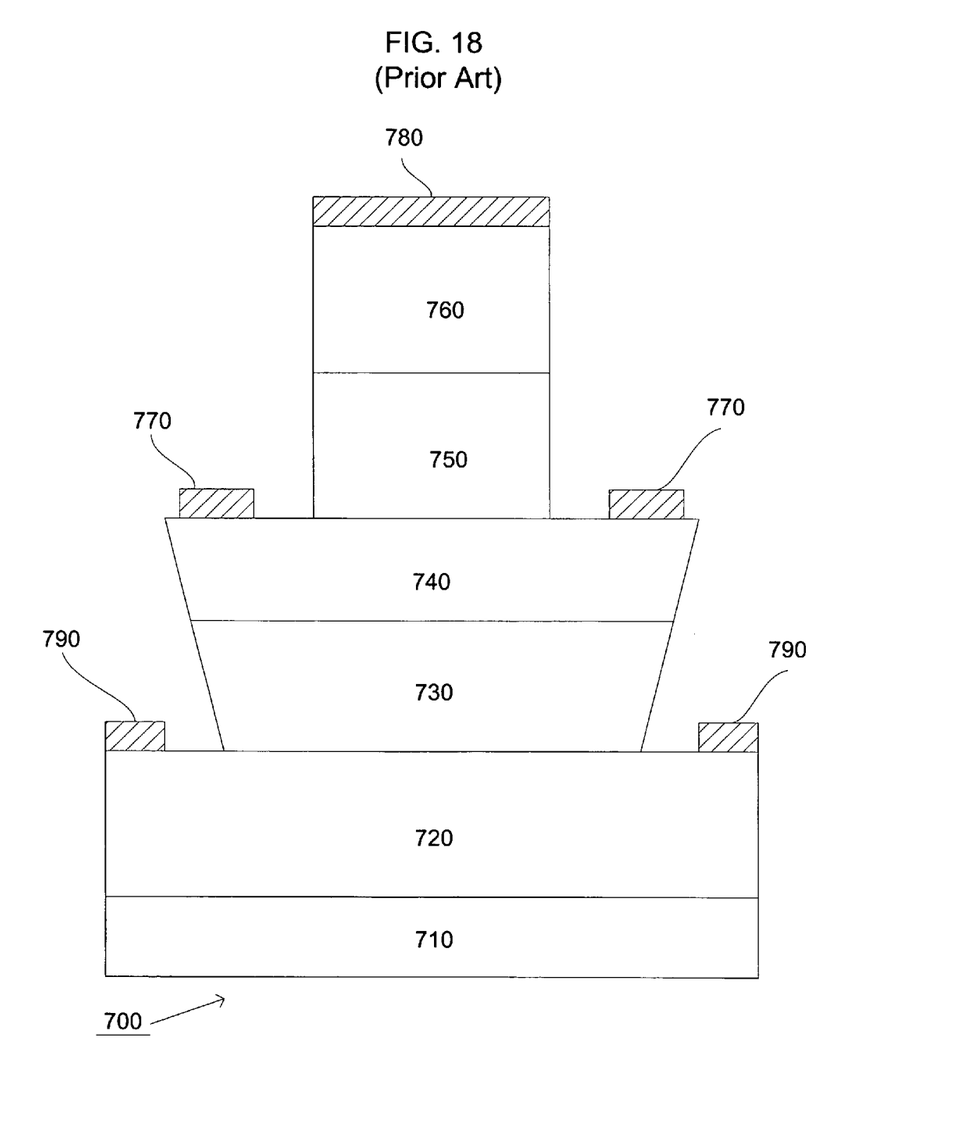
FIG. 18 is a cross-sectional view of an embodiment of a BEB geometry type interdigital transistor structure.

FIG. 18 illustrates a cross-sectional view of an interdigital transistor structure. This particular embodiment, 700, comprises a BEB type interdigital structure, although an EBE type would be similar except that the emitter and base finger portions would be interchanged. Thus, as illustrated, here 710 comprises a GaAs semi-insulating substrate. 720 comprises an n+ GaAs collector contact. This is sometimes called the subcollector 730 comprises an n GaAs collector and 740 comprises a p+ GaAs base mesa region. 750 and 760 respectively comprise an n AlGaAs (or InGaP) portion of the emitter and an n+ GaAs (cap) portion of the emitter. 770, 780 and 790 respectively comprise conductive contacts for the base, emitter, and collector. Viewing embodiment 700 from above would result in the arrangement illustrated in FIG. 1 of an emitter finger sandwiched by two base fingers.

It is noted that, typically, a trade-off exists between these two interdigital structures, EBE and BEB, between Ccb and Rb'. EBE structures typically have less capacitance and greater resistance, while BEB structures typically have more capacitance and less resistance. One potential explanation for this difference or trade-off is the geometries employed.

To explain at least in part the relationship between the geometries discussed and the associated capacitance and resistance, it may be observed that when the ratio of emitter periphery to base contact periphery is matched, the ratio of emitter periphery to base mesa area correlates inversely with extrinsic base resistance, whereas a ratio of the emitter area to base mesa area ratio correlates inversely with collector-base capacitance. For example, an increase in the former relationship may be associated with having a greater portion of an emitter region near base contacts so that less resistance is present when current flows from the emitter to the base. Likewise, an increase in the latter relationship may be associated with a larger transistor per unit of collector-base capacitance. In other words, the collector-base capacitance per unit of emitter area is reduced. Under these principles, the prior trade-off discussed between the different interdigital structures may potentially be explained. For example, an EBE interdigital structure employs more emitter area per base mesa area, thus, improving collector to base capacitance, but at the expense of resistance, since emitter fingers have base contacting fingers on one side. Likewise, for a BEB interdigital structure the emitter finger has base contacting fingers on each side, thereby improving resistance; however, the reduction in emitter area to base mesa area results in an increase in capacitance per unit emitter area.

Figure 19:
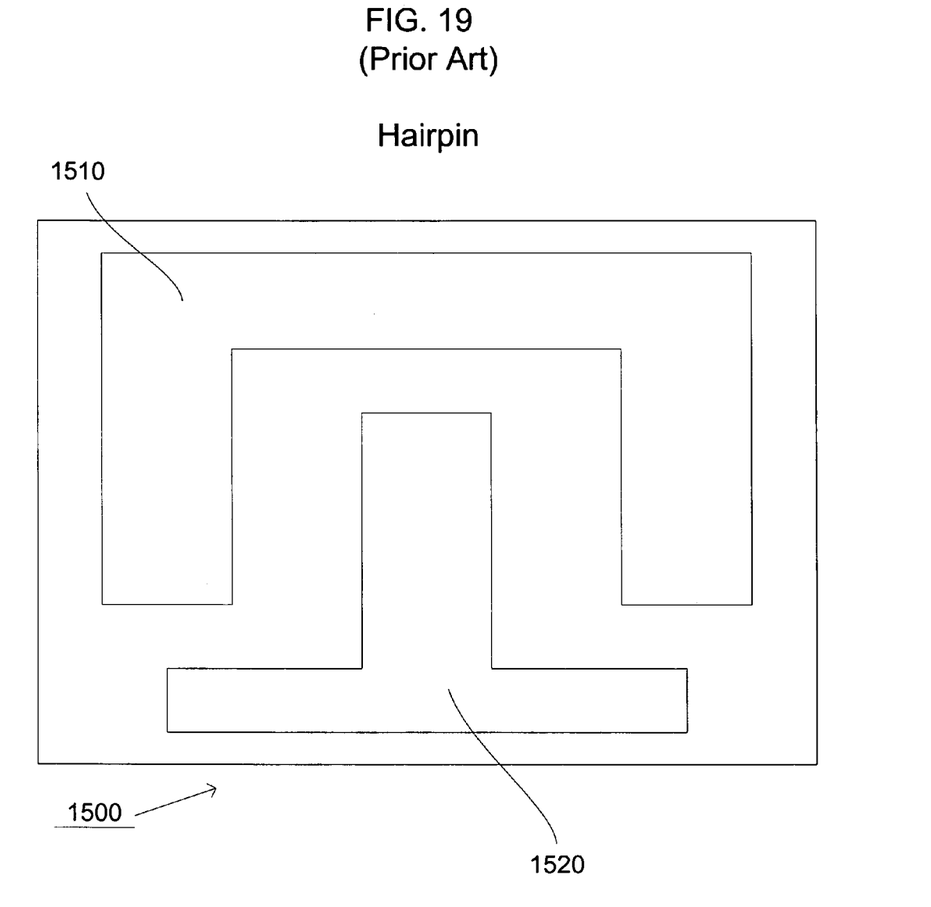
FIG. 19 is a plan view of yet another embodiment of a bipolar junction transistor.

In contrast to an interdigital geometry, such as previously described, FIG. 19 illustrates an embodiment 1500 of a hairpin geometry. This particular embodiment is shown in a plan view. As illustrated, emitter contact region 1510 (and, hence, the emitter region) forms a hairpin shape. Thus, the emitter occupies much of the perimeter of the base mesa and a greater portion of the base mesa area typically than the previously described geometries. In this manner, the collector-base capacitance is reduced. However, in order to at least in part address the increase in resistance that usually would result, base "finger" 1520 may be made wider to reduce the conductor and finger contact parts of base resistance.

Figure 20:
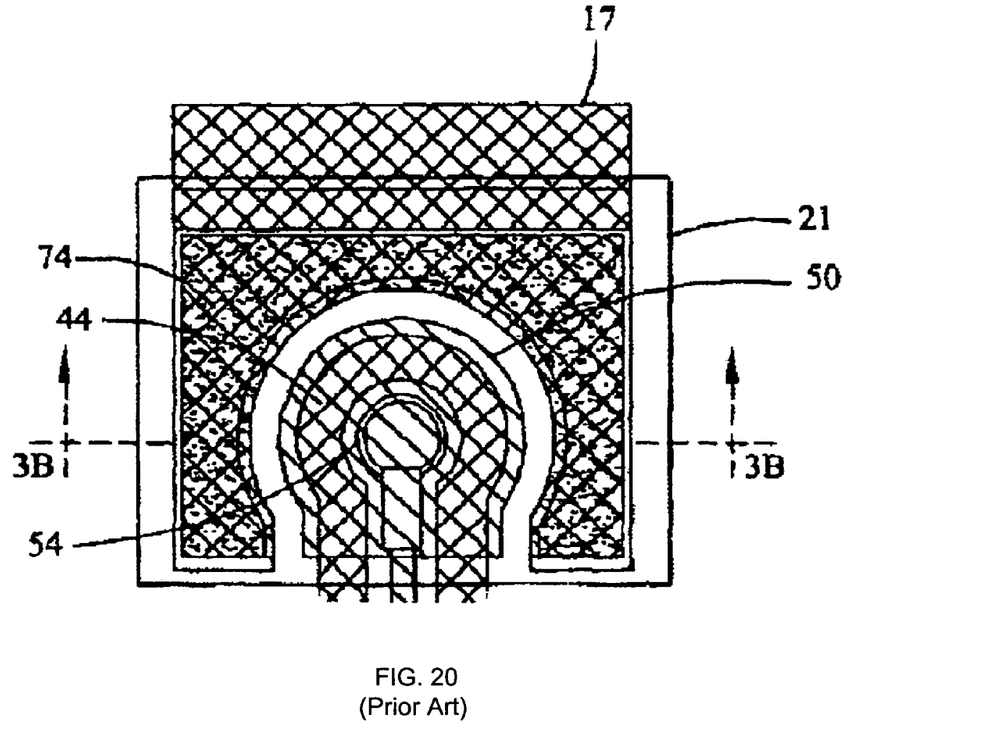
FIG. 20 is an example of a transistor geometry illustrated by U.S. Pat. Nos. 6,627,925 and 6,586,782.

Another transistor geometry comprises a circular annulus geometry described in U.S. Pat. No. 6,627,925, titled "Transistor having a novel layout and an emitter having more than one feed point," by Finlay, issued on Sep. 30, 2003, and U.S. Pat. No. 6,586,782, titled "Transistor layout having a heat dissipative emitter," by Finley, issued on Jul. 1, 2003, both assigned to Skyworks Solutions, Inc., of Irvine, Calif. FIG. 20 illustrates FIG. 3A of U.S. Pat. No. 6,627,925. As illustrated by base contact 54 and emitter 44, a sizable emitter region is employed. Consistent with the previous discussion, this results in a reduced collector-base capacitance relative to this emitter area.

As stated previously, the collector-base capacitance and base resistance of a transistor may affect the power added efficiency and gain of an RF or microwave power amplifier, for example, that employs the transistor. This may be desirable in linear power amplifier applications such as in CDMA handsets. As the collector-base capacitance is reduced, the power added efficiency of a linear power amplifier should increase. This is at least in part due to the reduction of output current flow through the lossy input resistance and due also at least in part to the power added efficiency improvement that results from increased gain. Likewise, as the collector-base capacitance is reduced, the gain should increase due at least in part to reduced Miller feedback capacitance. Both Maximum Stable Gain (MSG) and Maximum Oscillation Frequency (Fmax) (see equation [1]) may thereby increased. In contrast, an extrinsic base resistance reduction may have little impact on power added efficiency, but a reduction in extrinsic base resistance should improve gain due at least in part to increased Fmax. Given this, for linear power amplifier applications, such as in CDMA cell phones, laser drivers, WLAN for example, and saturated power amplifier applications, such as in GSM cell phones where improved power added efficiency and improved gain are both desirable, it would be beneficial to both have the ability to reduce collector-base capacitance and reduce extrinsic base resistance, or reduce collector-base capacitance without increasing extrinsic base resistance, rather than employ a trade-off between collector-base capacitance and extrinsic base resistance, as will typically occur with interdigital structures or other geometries, as previously explained. For example, battery life of a cell phone is a feature that consumers typically desire. Improving efficiency, therefore, permits battery life to be extended. Likewise, high current gain is desirable to reduce the current employed for the cell phone to operate, thus, also reducing power consumption.

Figure 5:
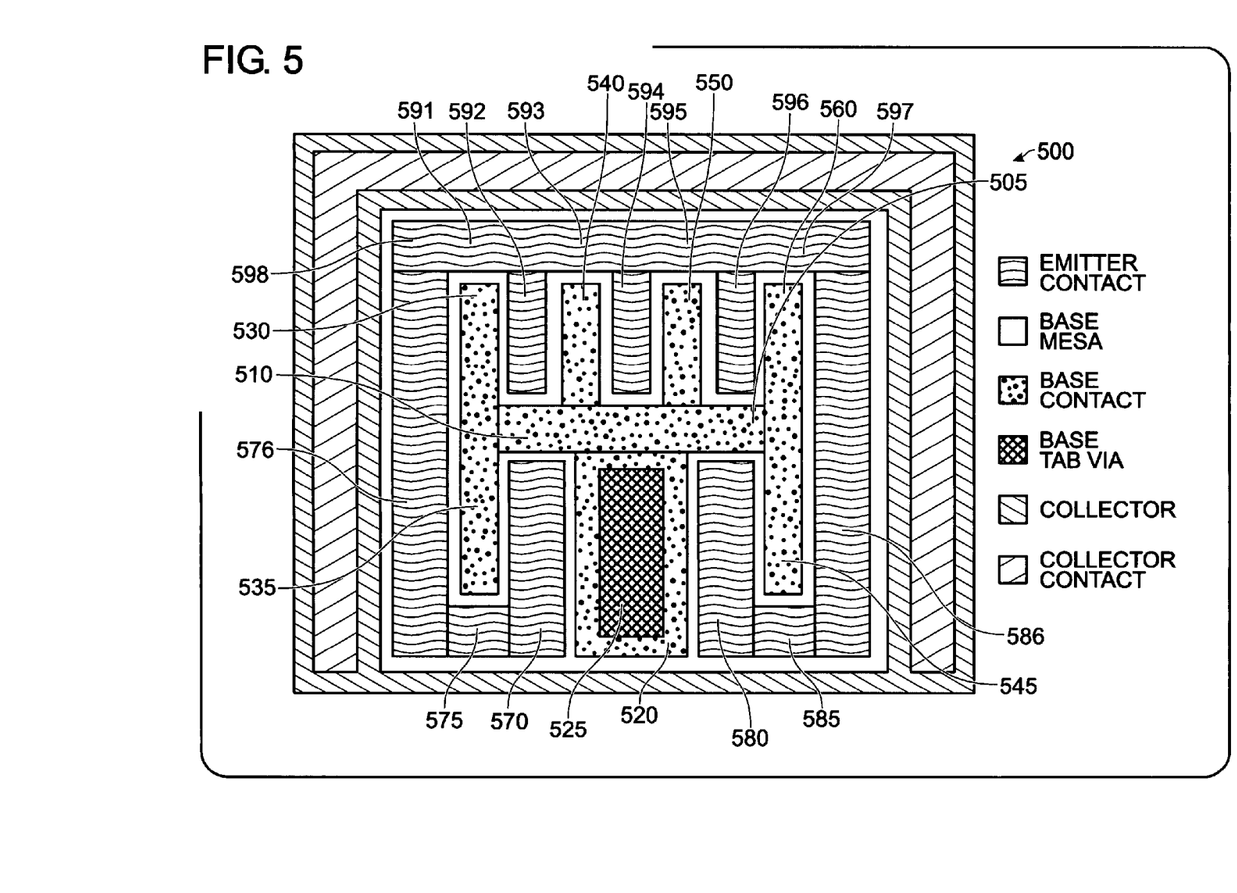
FIG. 5 is one embodiment of a bipolar junction transistor in accordance with the claimed subject matter.

FIG. 5 is a plan view of an embodiment of a bipolar junction transistor in accordance with the claimed subject matter. As shall become clear, however, FIG. 5 illustrates one particular embodiment and many other embodiments are included within the scope of the claimed subject matter. For this particular embodiment, the base contact region, designated 510 in FIG. 5, is referred to herein as a fishbone configuration. Hence, it includes a central "spine" 505 that contacts or connects with all of the finger extensions or smaller "bones" of the fish. This particular configuration illustrated here also includes a base contact "tab" region 525 having a surrounding base contact region 520, and base fingers or extensions 530, 540, 550, 560, 535, and 545. In addition to the fishbone base contact region configuration illustrated, embodiment 500 includes an emitter contact region that occupies the perimeter of the base mesa region with its outer periphery while also being adjacent to the periphery of the fishbone configuration with its inner periphery. Thus, for embodiment 500, emitter contact region 598 includes emitter fingers 570, 580, 592, 594 and 596, as well as the emitter contacts around the perimeter of the base region 575, 576, 585, 586, 591, 593, 595, and 597.

As described in more detail hereinafter, this particular embodiment has several characteristics that, according to principles previously articulated, are expected to result in reducing the collector-base capacitance, while also reducing or maintaining the extrinsic base resistance and, thus, should improve power gain and power added efficiency when employed, for example, in a linear power amplifier or similar device in which improved gain and power added efficiency are desirable.

FIG. 5 is a plan view of an embodiment in accordance with the claimed subject matter. As previously discussed, FIG. 18 illustrates typical cross-sectional geometric relationships between an emitter, base, and collector, such as for a BEB type interdigital transistor structure and FIG. 1 illustrates the plan view. It should be apparent, therefore, from a plan view of an embodiment of the claimed subject matter the desired arrangement for a cross-sectional view. For example, it is noted that emitter contact region 598 has an isomorphic shape with respect to the emitter region and is in direct physical contact with the top surface of the emitter region in this particular embodiment. Likewise, as previously described, contact regions, such as for the emitter and the base, for example, comprise a conductive material, such as metal, for example. However, whereas the emitter contact region has an isomorphic shape with respect to the emitter region, the base contact region is not isomorphic with respect to the base mesa region to allow space for the emitter region to be in direct physical contact with the base mesa.

The embodiment of a bipolar junction transistor illustrated in FIG. 5 may comprise a variety of semiconductor materials, such as, for example, Si, SiGe, GaAs, AlGaAs, InGaP, InP. Likewise, as suggested previously, this particular embodiment may comprise a heterojunction bipolar transistor, such as one that employs InGaP/GaAs, or one that employs AlGaAs/GaAs, as was previously described, for example. Of course, the claimed subject matter is not limited in scope to employing only these particular semiconductor materials or to heterojunction bipolar transistors in general.

As suggested, however, the embodiment illustrated in FIG. 5 provides several useful characteristics for the geometry of a bipolar junction transistor. For example, as illustrated and previously suggested, the emitter contact region, and, hence, the emitter region, occupies the perimeter of the base mesa region. An advantage of this approach is that it increases the emitter area relative to the base mesa area, thereby having the desirable effect of potentially reducing collector-base capacitance, as was previously suggested. Likewise, employing wider emitter fingers in the interior, where base contacts are available along most of the periphery, may also have a desirable effect of reducing collector-base capacitance.

Furthermore, as illustrated in FIG. 5, tab 525 with surrounding base contact 520, operates as a "proxy" or surrogate base finger. In comparison with the interdigital geometries illustrated in FIGS. 1 to 4, such as tab regions 140, 260, 340 and 460, this particular geometry makes improved use of a base "tab" region in the structure. As was suggested previously, this region allows an electrical connection to the base region through direct physical contact; however, interdigital type geometries typically make less beneficial use of such a region in terms of potentially reducing the base resistance, for example. Here, employing the tab as a proxy base finger potentially increases the amount of emitter periphery to base contact periphery, thus, potentially reducing the resistance while reducing the base mesa area and thereby the collector-base capacitance. Likewise, the fishbone configuration, in general, provides a greater amount of emitter periphery to base contact periphery than a typical interdigital structure and, therefore, potentially reduces base resistance. Thus, counting the base tab as a "finger," the fishbone configuration illustrated in FIG. 5 employs seven extensions, fingers or projecting bones. These extensions fan out from a central base contact spine 505 to which they are connected, as illustrated in FIG. 5 and discussed previously. With this approach, as shown by this example, the distance from contact tab via to base finger ends may be kept relatively short, thus, potentially reducing extrinsic base resistance. For example, here, the longest such distance is on the order of 15-20 microns, although, of course, the claimed subject matter is not limited in scope in this respect. However, for other geometries of similar total emitter area, such as interdigital type transistor structures, this length of a base finger may be 45 microns or longer.

Figure 6:
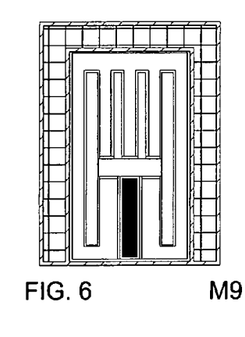
FIGS. 6 to 17 are alternate embodiments of bipolar junction transistors in accordance with the claimed subject matter.

It is noted, furthermore, that the claimed subject matter is not limited in scope to this number of extensions or to this particular arrangement of extensions. Thus, for example, FIG. 6 illustrates a geometry in which the fishbone configuration, including a base tab finger, employs six extensions from the center base contact or central spine. Likewise, FIGS. 6 to 17 illustrate varying geometries, designated M1 to M12. These embodiments illustrate a variety of different dimensions for the different regions of a transistor. However, although the claimed subject matter is not limited in scope in this respect, as one example, dimensions of at least one of the extensions from the spine of the fishbone configuration comprises 10 microns in length by 1 micron in width.

Figure 7:
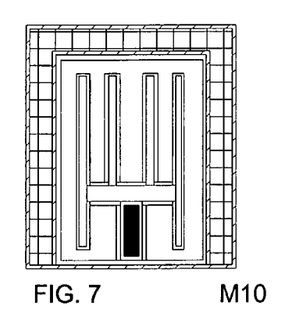
Figure 8:
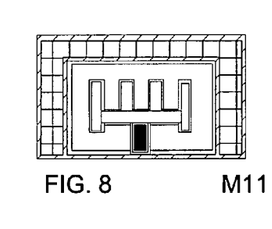
Figure 9:
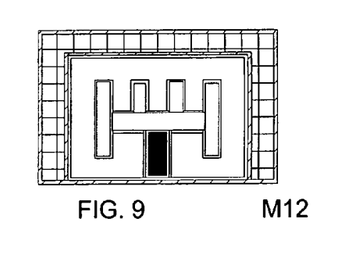
Figure 10:
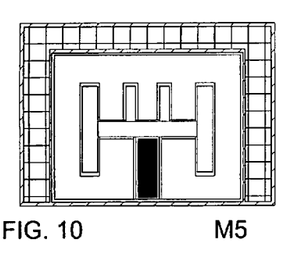
Figure 11:
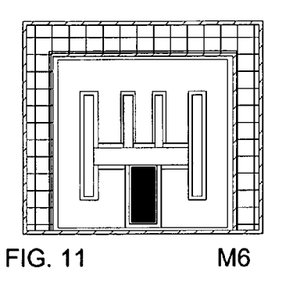
Figure 12:
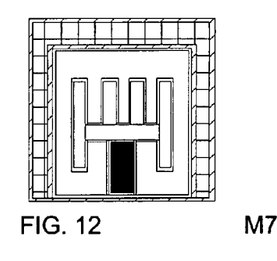
Figure 13:
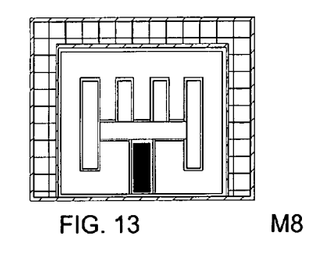
Figure 14:
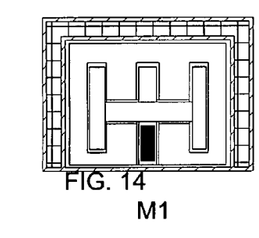
Figure 15:
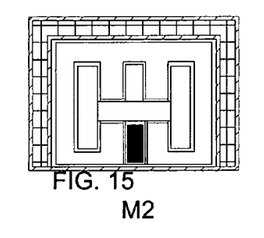
Figure 16:
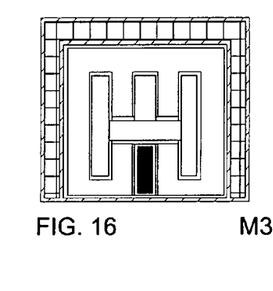
Figure 17:
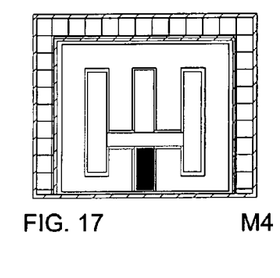

As a few other examples, although the claimed subject matter is not limited in scope in this respect, the transistor geometry of FIG. 7 (M10) has a device area of about 405 micrometers squared, as does FIG. 11 (M6), for example. In contrast, several of these sample embodiments have a smaller area, such as FIG. 12 (M7), which has roughly 240 micrometers squared. It is noted, here, that while the previous considerations or characteristics of the geometry may affect collector-base capacitance and base resistance, as previously discussed, the area of the device overall may impact thermal considerations, such as due to current flow and nonuniform heating, for example. A transistor cell can be thought of as comprised of a collection of smaller sub-cells that are connected in parallel. Within a transistor cell, nonuniformities in temperature may result in current 'hogging' and localized thermal runaway currents. The power dissipation level at which this may occur depends at least in part on cell geometry and overall cell size, regardless of geometry. Thus, depending on the particular application, various issues may be considered to determine an appropriate transistor geometry design embodiment. While, for example, the embodiment illustrated in FIG. 7 may provide improved performance in terms of collector-base capacitance and base resistance relative to FIG. 12, FIG. 12 may prove desirable by providing an acceptable reduction in collector-base capacitance and base resistance, but may also provide thermal advantages over the embodiment of FIG. 7. Again, these are merely example embodiments, and the claimed subject matter is not limited in scope to any particular size, shape or dimension.

Simulation results indicate that a bipolar junction transistor, such as a heterojunction bipolar transistor, for example, having the geometry illustrated by the embodiment in FIG. 5, for example, will provide reduced collector-base capacitance and base resistance in comparison with the interdigital geometries previously discussed. From simulation, for example, some embodiments have been demonstrated to have a more than 20 percent reduction in collector-base capacitance over a comparably sized BEB interdigital structure, while also providing a reduction in base resistance of over 40 percent over a comparable EBE interdigital structure. Of course, the improvement may vary depending upon dimensions, shape, materials employed, etc. Nonetheless, some embodiments have further demonstrated on the order of a 25 percent reduction in collector-base capacitance over BEB type structures and on the order of a 50 percent reduction over EBE type structures in base resistance. Gain and efficiency improvements in linear power amplifier operation on the order of 1 to 2 dB and 3 to 5% have been obtained with these new geometries.

Figure 21:
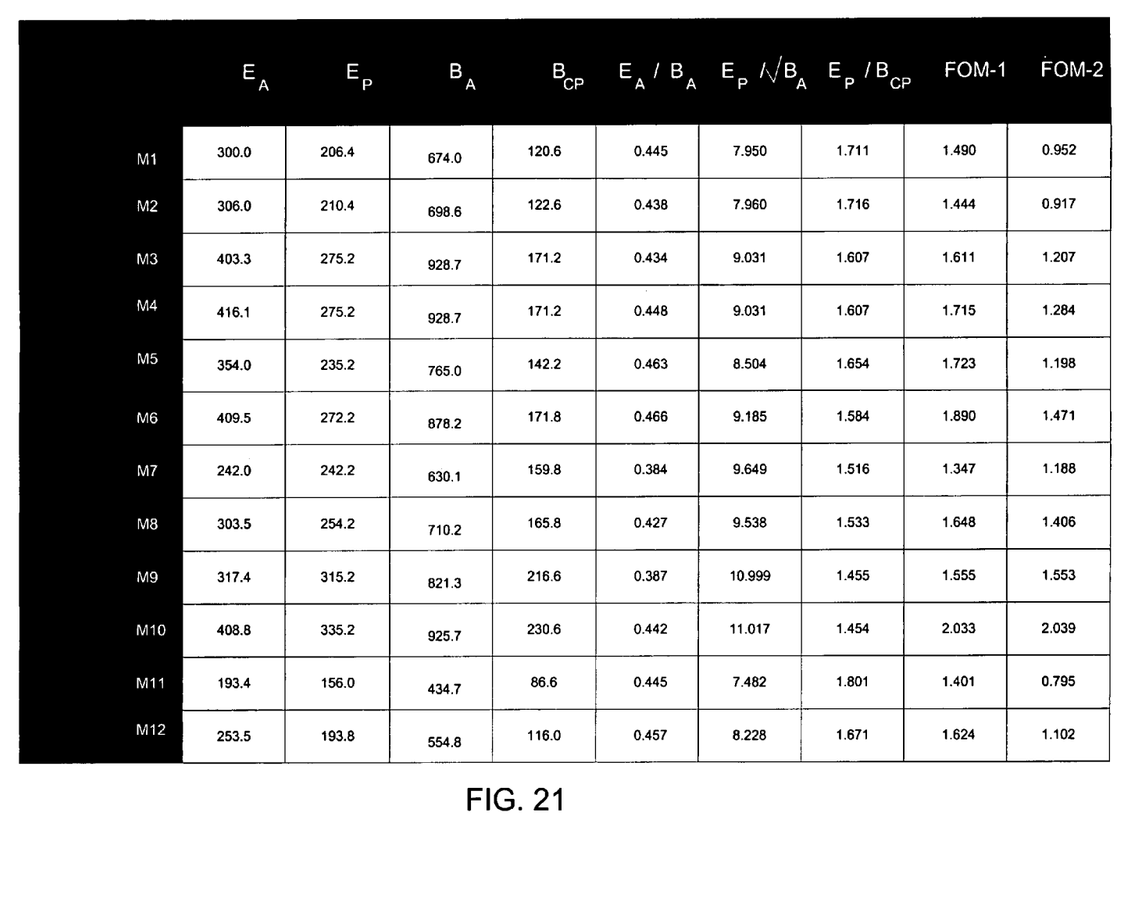
FIG. 21 is a table providing geometric calculations for potential embodiments in accordance with the claimed subject matter.
Figure 22:
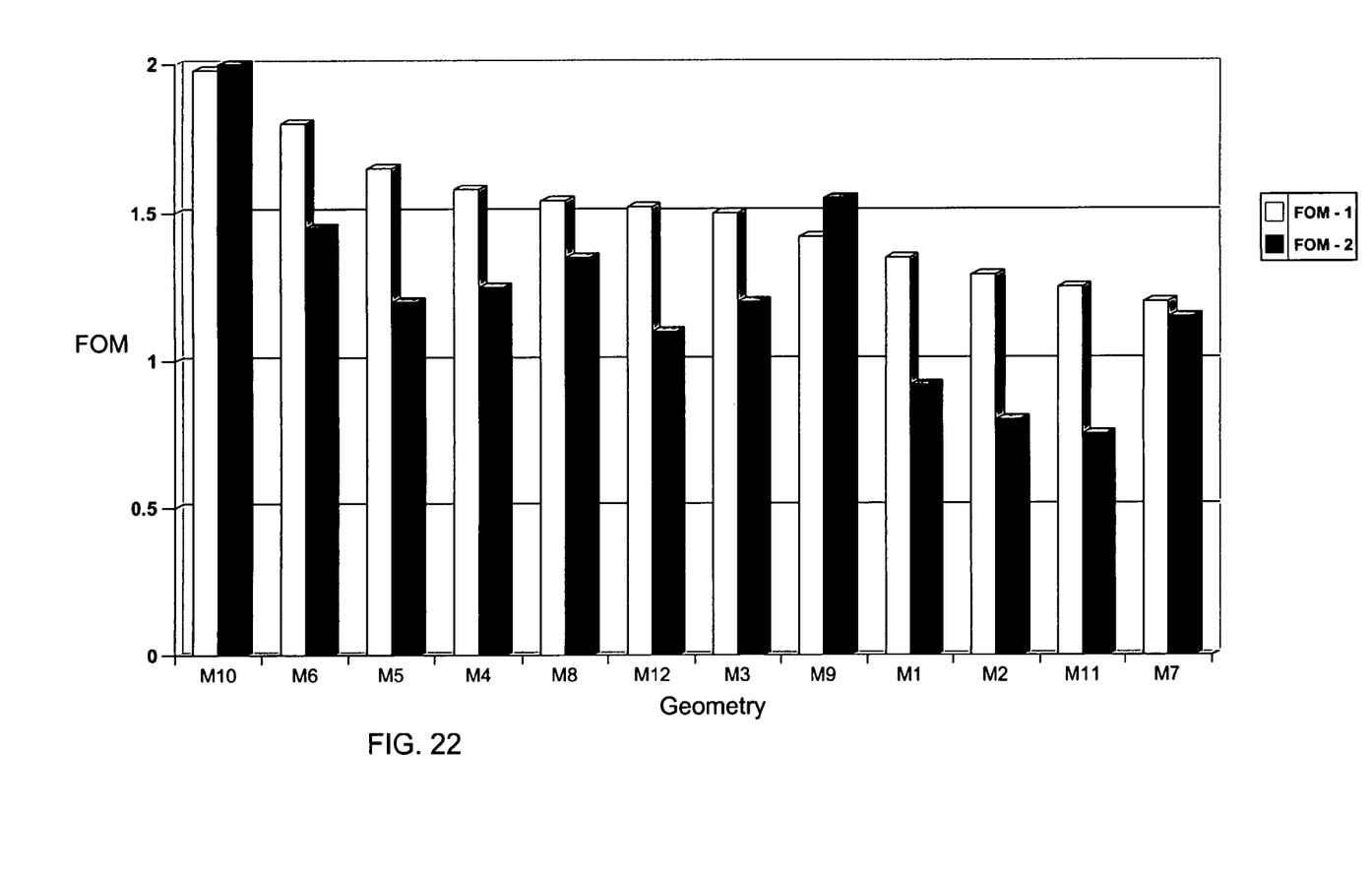
FIG. 22 is a bar chart of some of the calculations provided in FIG. 21.

FIG. 21 is a table illustrating geometric calculations for the embodiments shown in FIGS. 6 to 17. Again these are designated M1 through M12. As illustrated by the table, calculations include emitter area ($E_A$), emitter periphery ($E_P$), base area ($B_A$), and base contact periphery ($B_{CP}$). There numbers are employed to calculate ratios that may correlate directly or inversely with capacitance and resistance, as well as figures of merit (FOMs) for various embodiments. Thus, emitter area to base area (ratio1) is a ratio that may vary inversely to Ccb, such as for reasons previously discussed. Likewise, emitter periphery to square root of base area (ratio2) is a ratio that may also vary inversely to Rb', again, potentially for reasons discussed. Emitter periphery to base contact periphery (ratio3), on the other hand, ideally should be close to one and may adversely affect Rb' the more it deviates from one. These ratios may further be employed to produce FOMs. Here, FOM-1 comprises normalized ratio1 squared multiplied by normalized ratio2, and FOM-2 comprises FOM-1 multiplied by normalized ratio3. Thus, FOM-2 should more strongly reflect the impact on resistance of a particular embodiment than FOM-1. FIG. 22 is a bar chart making a side-by-side comparison of the two FOMs for the embodiments M1 through M12. Here, all embodiments indicate improved performance in comparison with a standard interdigital BEB type structure.

Apart from considerations related to transistor geometry, it is likewise noted that another approach to reducing collector-base capacitance may include reducing the effective size of the base mesa in the interior of the tab region through an ion implant that damages a portion, thereby reducing its area. For example, a multiple boron damage implant or oxygen damage implant may be employed. Alternatively, a high energy, high dose deep implant of $H^+/He^+$ may be employed. Furthermore, nearly any element may be employed for isolation and the claimed subject matter is intended to cover all such embodiments. This technique in conjunction with techniques such as those previously discussed to reduce collector-base capacitance provides improved performance over interdigital type transistor geometries and the like.

It is noted that the previously described bipolar junction transistor geometries may be fabricated by a number of techniques and the claimed subject matter is not limited in scope in this respect. However, in one embodiment in which a heterojunction bipolar transistor is fabricated, for example, material is grown on a semi-insulating GaAs substrate. These epitaxial layers may be grown by molecular beam epitaxy (MBE) or by metal-organic chemical vapor deposition (MOCVD), for example. A heavily doped $n^+$ GaAs layer with a concentration on the order of, for example, $4 \times 10^{18}$ cm$^{-3}$ may be grown on the semi-insulating substrate. This may be followed by a lightly doped n GaAs layer for the collector. The collector doping concentration may be, for example, on the order of $3 \times 10^{16}$ cm$^{-3}$. For the base mesa region, a heavily doped $p^+$ GaAs layer with a concentration greater than $5 \times 10^{18}$ cm$^{-3}$ may be used. For example, beryllium (Be) or carbon (C) may be used for the base doping. A wide band gap AlGaAs or InGaP layer may be grown for the emitter. A contacting structure may then be grown on top of the emitter layer to act as part of the emitter contact.

As previously suggested, the emitter contact region may be formed on the wafer so that it has the desired shape and will be adjacent to the periphery of the base contact region. The semiconductor comprising the emitter of the bipolar transistor is then removed except under the said emitter contact region. A base contact region may be formed on the wafer having a fishbone configuration, such as previously discussed. Any one of a variety of metals or other conductive materials and any one of a number of deposition techniques may be employed. The conductive material may be sputtered or evaporated onto the surface of the wafer. The conductive material may be patterned with an etch back technique or with a lift-off technique, for example. Again, any one of a number of techniques and metal materials may be employed. Typical materials used to form the emitter and base contacts regions would include TiW, Ti, Pt, Si, Al, Cu, and Au, depending, for example on the particular semiconductor. Likewise, as previously discussed, other semiconductor materials other than those just described may be employed. Likewise, the transistor formed may comprise a homojunction bipolar junction transistor, rather than a heterojunction bipolar transistor, for example.

It will, of course, also be understood that, although particular embodiments have just been described, the claimed subject matter is not limited in scope to a particular embodiment or implementation. For example, one embodiment may be in hardware, such as implemented on a device or combination of devices, as previously described, for example. Likewise, although the claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method of manufacturing a BJT in accordance with the claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, the claimed subject matter is not limited in scope to this example.

In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. A bipolar junction transistor comprising:
   a base mesa region that includes a perimeter;
   a base contact region that includes a spine with at least one base finger that extends from one side of the spine and at least one base finger that extends from a second side of the spine, and
   an emitter region that includes
      an inner periphery that is adjacent to a periphery of said spine and base fingers, and
      an outer periphery that occupies a portion of the perimeter of the base mesa region,
      wherein the portion of the perimeter of the base mesa region that is occupied by the outer periphery of the emitter region surrounds the base contact region on a plurality of sides.

2. The bipolar junction transistor of claim 1,
   further comprising an emitter contact region having an isomorphic shape with respect to said emitter region and being in direct physical contact with the top surface of said emitter region.

3. The bipolar junction transistor of claim 2, wherein said contact regions comprise a conductive material.

4. The bipolar junction transistor of claim 3, wherein said conductive material comprises metal.

5. The bipolar junction transistor of claim 1, further comprising at least one of the following semiconductor materials: Si, SiGe, GaAs, AlGaAs, InGaP, InP.

6. The bipolar junction transistor of claim 1, wherein said bipolar junction transistor comprises a heterojunction bipolar transistor.

7. The bipolar junction transistor of claim 6, wherein a base region contacting tab is embedded within an extension from the spine.

8. The bipolar junction transistor of claim 1, wherein said bipolar junction transistor comprises an AlGaAs/GaAs heterojunction bipolar transistor or an InGaP/GaAs heterojunction bipolar transistor.

9. The bipolar junction transistor of claim 1, wherein dimensions of at least one of the extensions from said spine comprises: 10 microns in length by 1 micron in width.

10. The bipolar junction transistor of claim 1, wherein a longest distance between a base contact tab via and an end of a first base finger is on an order of about 15 to 20 microns.

11. The bipolar junction transistor of claim 1, wherein the inner periphery of the emitter region is adjacent to three sides of individual base fingers that extend from the spine.

12. An apparatus comprising:
   a battery; and
   a power amplifier coupled with the battery and configured to amplify a radio frequency signal, the linear power amplifier including a heterojunction bipolar transistor (HBT) having:
      a base mesa region that includes a perimeter;
      a base contact region that includes a spine with at least one base finger that extends from one side of the spine and at least one base finger that extends from a second side of the spine, and
      an emitter region that includes:
         an inner periphery that is adjacent to a periphery of said spine and base fingers, and
         an outer periphery that occupies a portion of the perimeter of the base mesa region,
         wherein the portion of the perimeter of the base mesa region that is occupied by the outer periphery of the emitter region surrounds the base contact region on a plurality of sides.

13. The apparatus of claim 12, wherein the apparatus comprises a mobile phone.

14. The apparatus of claim 12, wherein said power amplifier is a saturated power amplifier.

15. The apparatus of claim 12, wherein said HBT comprises an AlGaAs/GaAs HBT or an InGaP/GaAs HBT.

16. The apparatus of claim 12, wherein dimensions of at least one of the base fingers comprises: 10 microns in length by 1 micron in width.

17. The apparatus of claim 12, wherein a longest distance between a base contact tab via and an end of a first base finger is on an order of about 15 to 20 microns.

18. The apparatus of claim 12, wherein the HBT comprises at least five base fingers connected to said spine.

19. The apparatus of claim 12, wherein the HBT comprises at least six base fingers connected to said spine.

20. The apparatus of claim 12, wherein the inner periphery of the emitter region is adjacent to three sides of individual base fingers that extend from the spine.

* * * * *

UNITED STATES PATENT AND TRADEMARK OFFICE
CERTIFICATE OF CORRECTION

PATENT NO.         : 8,159,048 B2
APPLICATION NO.    : 10/769571
DATED              : April 17, 2012
INVENTOR(S)        : Thomas R. Apel and Jeremy R. Middleton It is certified that error appears in the above-identified patent and that said Letters Patent is hereby corrected as shown below:

In the Claims:

In claim 5, col. 10, line 5, "..., A1GaAs, ..." should read -- ..., AlGaAs, ... --;

In claim 8, col. 10, line 13, "... an A1GaAs/GaAs ..." should read -- an AlGaAs/GaAs ... --.

Signed and Sealed this
Tenth Day of September, 2013

Teresa Stanek Rea
*Acting Director of the United States Patent and Trademark Office*